US006762499B2

United States Patent
Nakadaira

(10) Patent No.: US 6,762,499 B2
(45) Date of Patent: Jul. 13, 2004

(54) SEMICONDUCTOR INTEGRATED DEVICE

(75) Inventor: Masao Nakadaira, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/622,728

(22) Filed: Jul. 21, 2003

(65) Prior Publication Data
US 2004/0016980 A1 Jan. 29, 2004

(30) Foreign Application Priority Data
Jul. 25, 2002 (JP) ......................................... 2002-216310

(51) Int. Cl.[7] .......................... H01L 23/48; H01L 29/00
(52) U.S. Cl. ........................ 257/758; 257/508; 257/750; 257/781; 257/211; 257/762; 438/622
(58) Field of Search ................................. 257/758, 508, 257/208, 209, 210, 211, 797, 734, 750, 773, 776, 765, 781, 759, 760, 752, 762, 774; 438/622, 118, 348, 361

(56) References Cited

U.S. PATENT DOCUMENTS 6,100,573 A * 8/2000 Lu et al.

6,297,563 B1 * 10/2001 Yamaha

FOREIGN PATENT DOCUMENTS

JP 2001-114309 4/2000
JP 2001-358169 12/2001

* cited by examiner

Primary Examiner—Wael Fahmy
Assistant Examiner—Dilinh Nguyen
(74) Attorney, Agent, or Firm—Young & Thompson

(57) ABSTRACT

A semiconductor integrated device includes a first insulating film 407 formed on any one of a conductive layer 406 and an interlayer insulating film 405, a first layer pad 408 which is in a two-layer pad and which is formed on the first insulating film 407, a third insulating film 413 deposited on both of the first insulating film 407 and the first layer pad 408 of the two-layer pad, a conductive plug 411 which is arranged to connect upper and lower pads of the two-layer pad and which is formed in the third insulating film 413, a second layer pad 401 which is in the two-layer pad and which is formed on the third insulating film 413, a second insulating film 409 which is formed on any one of the conductive layer 406 and the interlayer insulating film 405 and which has a film thickness greater than that of the first insulating film 407, and a single-layer pad 421 formed on the second insulating film 409. The single-layer pad is used at the time of a wafer test, and the second layer pad of the two-layer pad is used at the time of wire bonding.

14 Claims, 8 Drawing Sheets

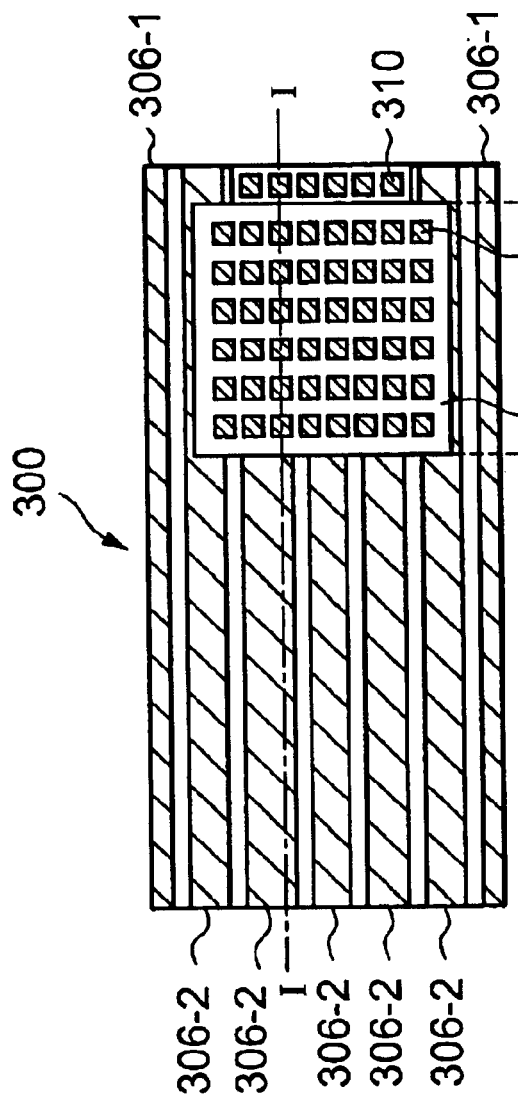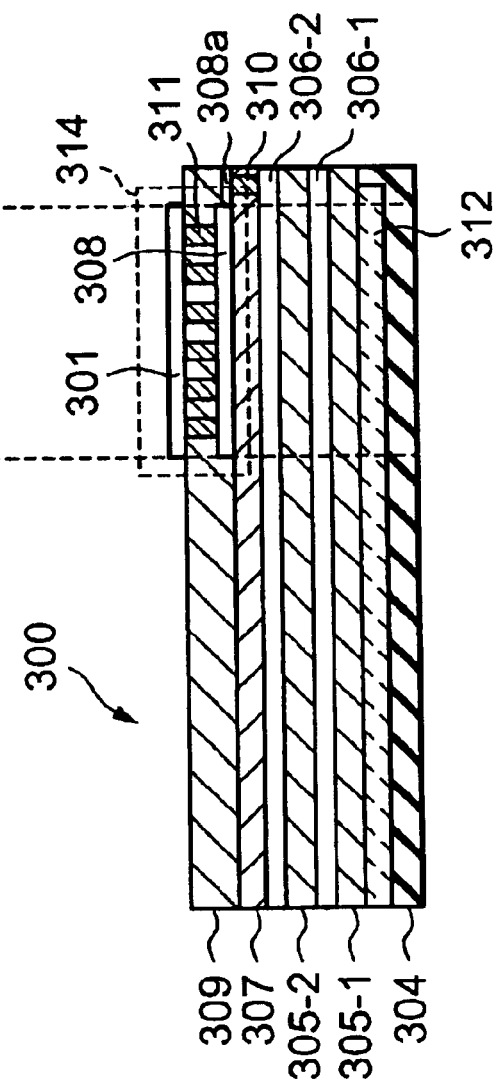
Fig. 3A PRIOR ART
Fig. 3B PRIOR ART

SEMICONDUCTOR INTEGRATED DEVICE

BACKGROUND OF THE INVENTION

1. Field of the Invention

The present invention relates to a semiconductor integrated device. In particular, the present invention relates to a semiconductor integrated device in which damage to circuits under pads at the time of wafer test and the occurrence rate of cracks in circuits under pads are reduced without detriment to wire bonding characteristics.

2. Description of the Prior Art

In recent years, it has been well known that information electronic equipment comprises semiconductor integrated devices which contain transistors. As shown in FIG. 1, a semiconductor chip 101 of the semiconductor integrated device has an internal circuit area 102 which contains transistors, and I/O buffers 103 on the periphery of the semiconductor chip 101. The I/O buffers 103 are configured to connect the internal circuit area 102 and external devices. The semiconductor chip 101 further has pads 104 connected to the I/O buffers 103 by interconnection lines 105. In particular, in the case where the semiconductor chip 101 is large in size, the semiconductor chip 101 has many I/O buffers 103.

Moreover, in a semiconductor integrated device of this type, it has been also known that the manufacturing yield of the semiconductor integrated device is improved by reducing the area occupied by a chip. Specifically, as shown in FIG. 2, in a semiconductor chip 201 of this type, pads 204 are arranged in I/O buffers 203 in order to reduce the area occupied by a chip.

Moreover, it has been also publicly known that a two-metal-layer structure is adopted as the structure of the pad 204. The pad 204 has a multilayer structure in upper and lower sides of which have two ore more layers of conductive films which are connected by a plurality of conductive plugs. Such a conductive pad having two or more layers in upper and lower sides therein is disclosed in, for example, Japanese Patent Laid-Open Publication No. 2001-358169.

FIG. 3A depicts a plan view of an I/O buffer 300 containing the conventional pad of the above described structure. FIG. 3B depicts a cross-sectional view taken along the line I—I in FIG. 3A.

The conventional I/O buffer 300 has a semiconductor substrate 304 and a semiconductor device 312 formed on the semiconductor substrate 304. The conventional I/O buffer 300 further has insulating films (305-1, 305-2, and 307) in a plurality of layers and conductive films (306-1 and 306-2) in a plurality of layers, both of which are formed on the semiconductor device 312.

Furthermore, the conventional I/O buffer 300 has a pad 314 comprising a conductive pad 301 in an upper layer, a conductive pad 308 in a lower layer, and conductive plugs 311 which connect the conductive pads (301 and 308) in the upper and lower two layers. Moreover, the conventional I/O buffer 300 has an insulating film 309 disposed in the uppermost layer.

Here, in the plan view of FIG. 3A, the conductive plugs 311 are depicted as if they can be seen, for convenience of explanation, though they cannot be seen due to the conductive pad 301 actually. Moreover, the conductive films (306-1 and 306-2) are also depicted as if they can be seen, for convenience of explanation.

In the pad 314, the conductive pad 308 in the lower layer is formed on an interlayer insulating film 307, and furthermore, the conductive pad 301 in the upper layer is formed thereon with an interlayer insulating film 309 interposed therebetween. An interconnection line 308a to be connected to an internal circuit is led from the conductive pad 308 in the lower layer. The conductive pad 308 in the lower layer and the conductive pad 301 in the upper layer are connected by the plurality of conductive plugs 311. Here, the conductive plugs 311 are arranged in the form of a square grid over the entire surfaces of the conductive pads at the minimum spacing specified by a design standard, or at approximately the minimum spacing.

Note that technologies for arranging conductive pads in a plurality of layers and connecting the conductive pads using conductive plugs have been publicly known by, for example, Japanese Patent Laid-Open Publication No. 2000-114309 and the like.

In the conventional semiconductor chip 201 described above, after a manufacturing process in a wafer state has been completed, the pads 314 are explored with probes for testing. Moreover, after the semiconductor chip 201 has been separated into each individual chip and die-bonded to an island of a package, wires are bonded to the pads 314. Probing is performed on the pads obliquely from above. Further, at the time of wire bonding, ultrasonic vibration is applied to a tool.

However, in the pad structure of FIG. 3A, cracks are apt to occur under the pads due to stress during probing or wire bonding. A wafer test and wire bonding with these pads 314 having a two-metal-layer structure cause considerable damage to conductive films, insulating films, and circuit devices arranged under the pads. On the other hand, if a single-metal-layer structure is adopted in order to avoid damage, pads tend to be peeled off. This causes deterioration in bonding characteristics.

SUMMARY OF THE INVENTION

Accordingly, an object of the present invention is to provide a semiconductor integrated device in which damage to circuits under pads at the time of a wafer test and the occurrence rate of cracks in circuits under pads can be reduced without detriment to wire bonding characteristics in a layout structure in which circuits exist under pads (such a layout structure is referred to as "Circuit Under Pad" and hereinafter abbreviated to CUP).

A semiconductor integrated device of the present invention includes a first insulating film and a second insulating film formed on any one of a conductive layer and an interlayer insulating film, a lower layer pad of a two-layer pad formed on the first insulating film, a third insulating film deposited on both of the first insulating film and the lower layer pad of the two-layer pad, a conductive plug which to connects upper and lower pads of the two-layer pad and which is formed in the third insulating film, a upper layer pad which is in the two-layer pad and which is formed on the third insulating film, a second insulating film which is formed on any one of the conductive layer and the interlayer insulating film and which has a film thickness greater than that of the first insulating film, and a single-layer pad formed on the second insulating film.

The single-layer pad is bonded without a bonding wire, and the second layer pad of the two-layer pad is bonded with the bonding wire.

BRIEF DESCRIPTION OF THE DRAWINGS

FIG. 3A depicts a plan view of an example of a conventional pad structure.

FIG. 3B depicts a cross-sectional view of the conventional pad structure shown in FIG. 3A, taken along the line I—I.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Next, embodiments of a semiconductor integrated device of the present invention will be described in detail with reference to drawings.

(First Embodiment)

Figure 4A:
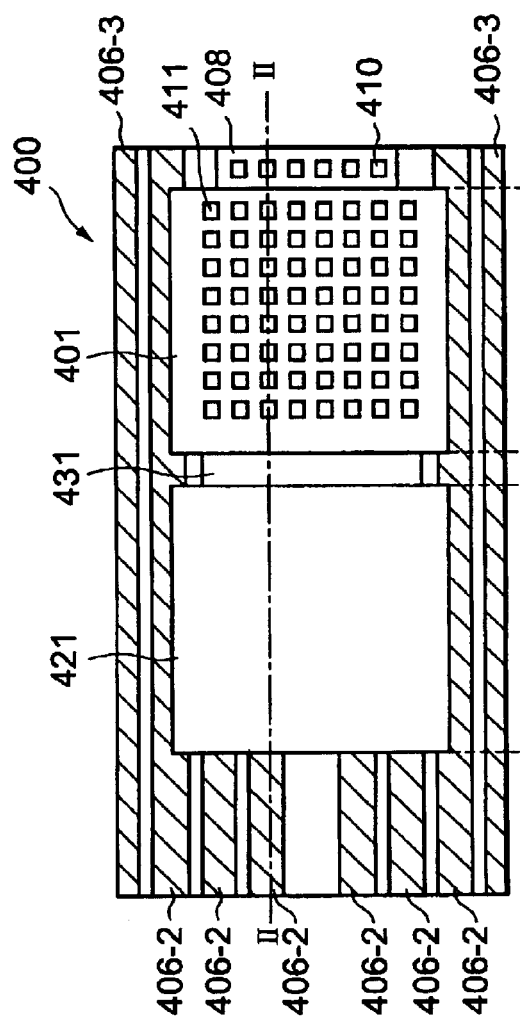
FIG. 4A depicts a plan view of an example of a pad structure according to a first embodiment of the present invention.
Figure 4B:
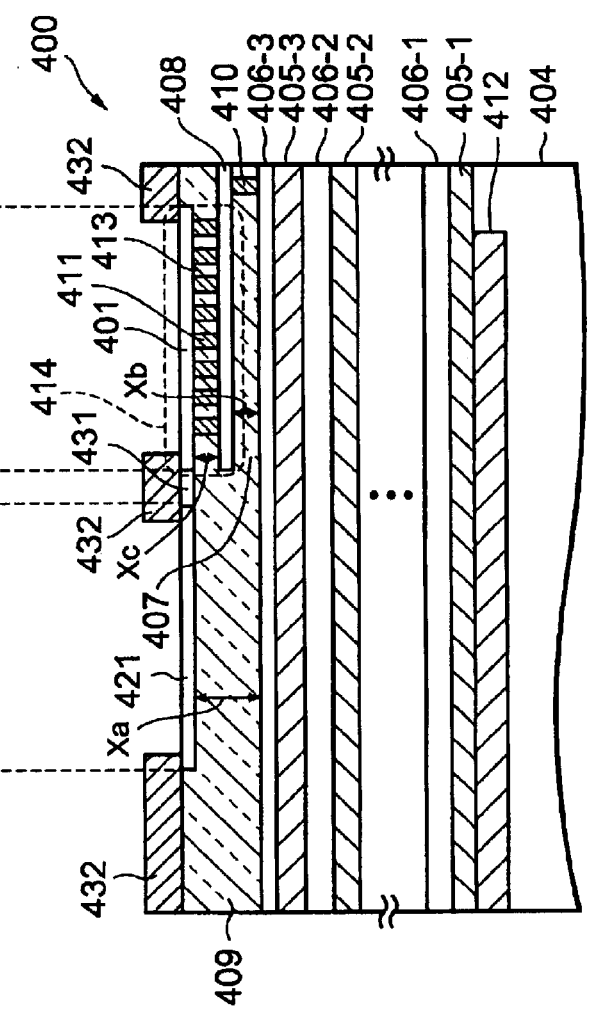
FIG. 4B depicts a cross-sectional view of the pad structure according to the first embodiment of the present invention shown in FIG. 4A, taken along the line II—II.

FIG. 4A depicts a plan view of an example of a pad structure of a semiconductor integrated device according to a first embodiment of the present invention. FIG. 4B depicts a cross-sectional view of the pad structure of the semiconductor integrated device according to the first embodiment of the present invention shown in FIG. 4A, taken along the II—II line.

Figure 1:
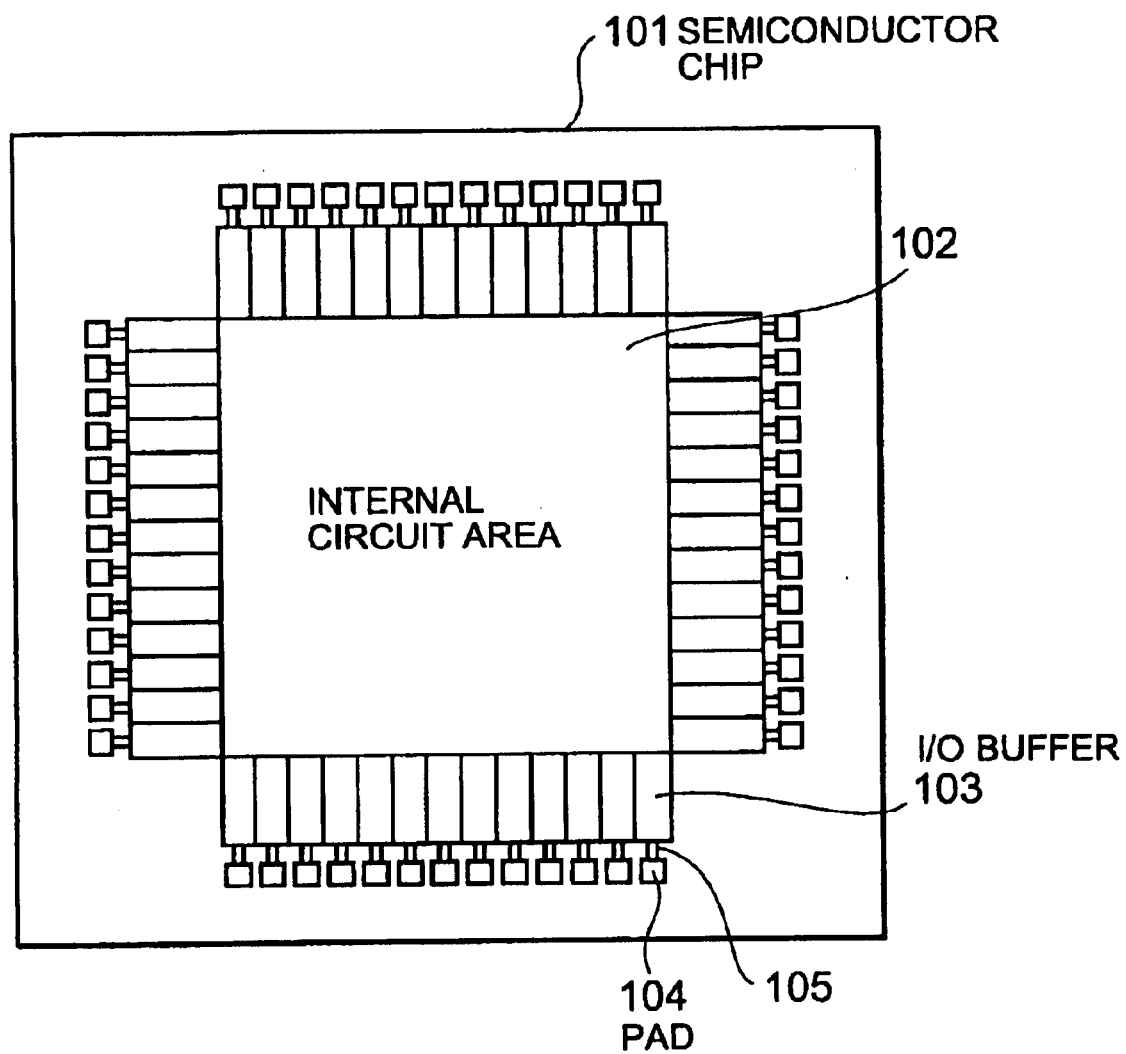
FIG. 1 depicts a plan view of the entire configuration of a chip.
Figure 2:
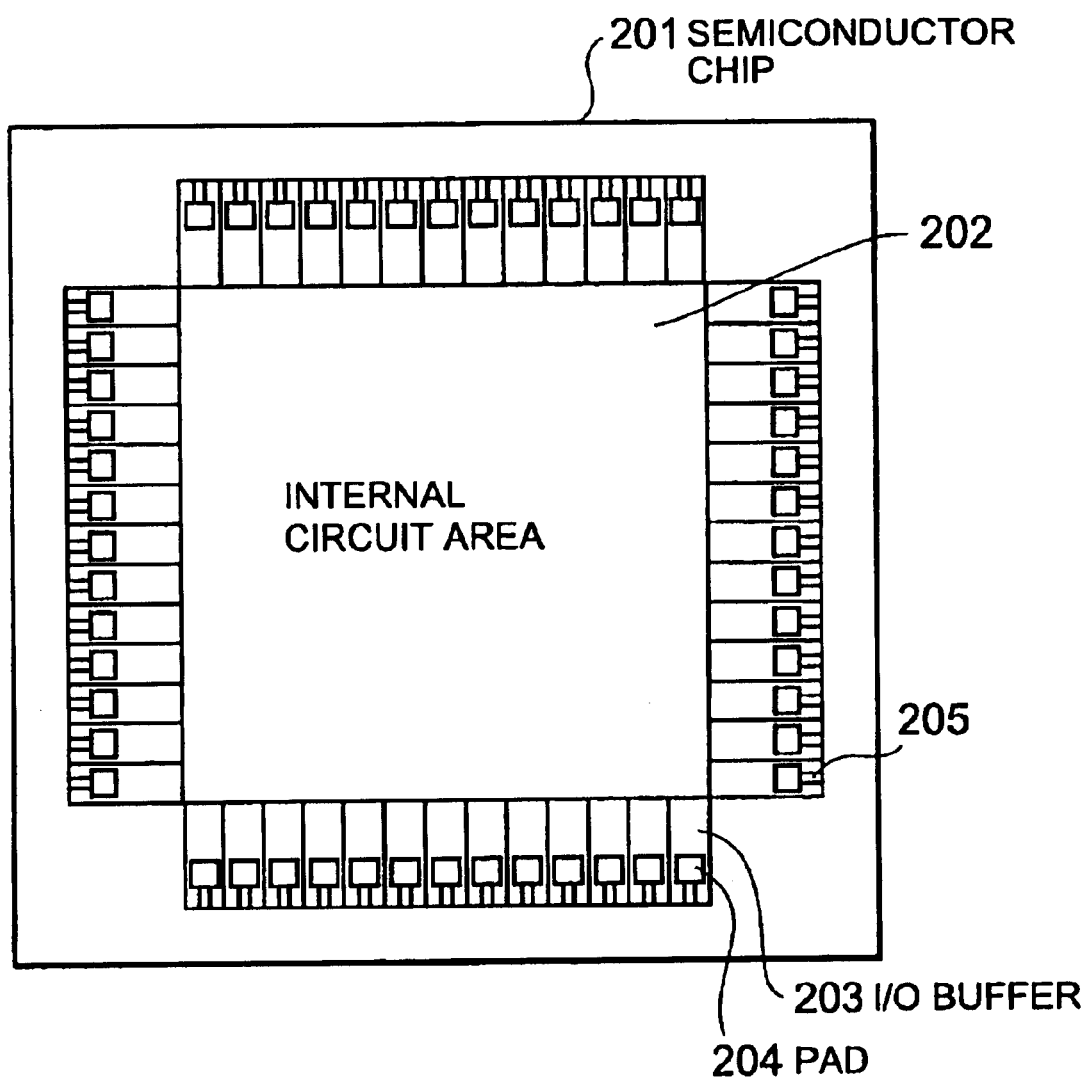
FIG. 2 depicts a plan view of the entire configuration of another chip.

It is noted that this pad structure is provided for a semiconductor chip having an internal circuit area and a plurality of buffer areas, similarly to the chip as shown in FIG. 2. The internal circuit area includes a great number of circuit elements, by which functional blocks are constituted. An input/output buffer is provided in each of the buffer areas. The pad structure shown in FIG. 4 is formed above each buffer area.

Referring to FIGS. 4A and 4B, the semiconductor integrated device 400 according to the first embodiment of the present invention comprises a semiconductor substrate 404 and an I/O buffer circuit pattern 412 formed on the semiconductor integrated substrate 404. The semiconductor integrated device 400 further comprises metal conductive layers (406-1, 406-2, and 406-3) in a plurality of layers (e.g., (n−1) layers, where n is a positive integer) and insulating films (405-1, 405-2, and 405-3) in a plurality of layers, both of which are necessary for an internal circuit of the semiconductor integrated device 400.

Further, the semiconductor integrated device 400 according to the first embodiment of the present invention has a first insulating film 407 with a film thickness of Xb and a second insulating film 409 with a film thickness of Xa on the metal conductive pattern 406-3. Moreover, the semiconductor integrated device 400 has conductive plugs 410 for connecting an internal circuit pattern and pads.

Furthermore, in the semiconductor integrated device 400 according to the first embodiment of the present invention, a first layer pad 408 of a two-layer pad 414 is formed using an nth metal conductive layer. Moreover, a third insulating film 413 with a film thickness of Xc is deposited. On the third insulating film 413, a second layer pad 401 of the two-layer pad 414 is formed. At this time, the film thickness Xa of the second insulating film 409 is made to be greater than the film thickness Xb of the first insulating film 407. Moreover, the film thickness Xb of the first insulating film 407 may be made to be greater than the film thickness Xc of the third insulating film 413.

In addition, in the semiconductor integrated device 400 according to the first embodiment of the present invention, a plurality of conductive plugs 411 are formed in order to connect the pads 401 and 408 and to increase the adhesive strength of the upper pad 401.

In the semiconductor integrated device 400 according to the first embodiment of the present invention, the two-layer pad 414 is used when wire bonding is performed on the semiconductor integrated device 400. In general, the conductive plugs are arranged so that the number of plugs is maximized. Thus, maximizing the number of plugs increases the adhesive strength between the conductive pads in the upper and lower two layers, thereby making it possible to prevent the conductive pad in the upper layer from being peeled off during wire bonding.

Furthermore, in the semiconductor integrated device 400 according to the first embodiment of the present invention, a single-layer pad 421 is formed on the second insulating film 409 with a film thickness of Xa, in a (n+1)th metal conductive layer. In the semiconductor integrated device 400 according to the first embodiment of the present invention, the single-layer pad 421 is used when probing is performed in a wafer test of the semiconductor integrated device 400.

Note that the second layer pad 401 of the two-layer pad, the single-layer pad 421, and an interconnection line 431 for connecting both the pads are constituted in the (n+1)th metal conductive layer in order to reduce the number of manufacturing steps.

The conductive pads (401 and 408) are formed from alloy mainly of aluminum, copper, or the like. Moreover, the conductive plugs (410 and 411) are formed from high melting point metal, such as tungsten, or alloy mainly of aluminum, copper, or the like similarly to the conductive pads (401 and 408).

The film thickness of the conductive pad 401 is preferably 0.8 $\mu$m to 1.2 $\mu$m in the case where the material thereof is aluminum. On the other hand, in the case where the material of the conductive pad 401 is copper, the film thickness thereof is preferably 1.0 $\mu$m to 2.0 $\mu$m.

The film thickness of the conductive pad 408 is preferably 0.5 $\mu$m to 1.2 $\mu$m in the case where the material thereof is aluminum. On the other hand, in the case where the material of the conductive pad 408 is copper, the film thickness thereof is preferably equal to that of the conductive pad 401, i.e., 1.0 $\mu$m to 2.0 $\mu$m.

Note that the conductive pad 408 can be formed to a film thickness thinner than the conductive pad 401 by appropriately selecting a process of manufacturing copper interconnection lines.

The interlayer insulating films (405-1, 405-2, 405-3, 407, 409, and 413) are formed of silicon oxide films deposited by plasma CVD or the like. The entire surface of the semiconductor chip is covered with a passivation film 432, which is removed only on the pads (401 and 421). Note that the structure below the interlayer insulating film 405-2 is not shown in FIG. 4B.

The film thickness of each interlayer insulating film (405-1, 405-2, or 405-3) can be appropriately set in the range of 0.5 $\mu$m to 1.2 $\mu$m. The second insulating film 409 is formed so that the film thickness Xa thereof may be approximately 1.0 $\mu$m, and the first insulating film 407 is formed so that the film thickness Xb thereof may be approximately 0.5 $\mu$m. Thus, the film thickness Xa of the second insulating film 409 is made greater than the film thickness Xb of the first insulating film 407.

Figure 8:
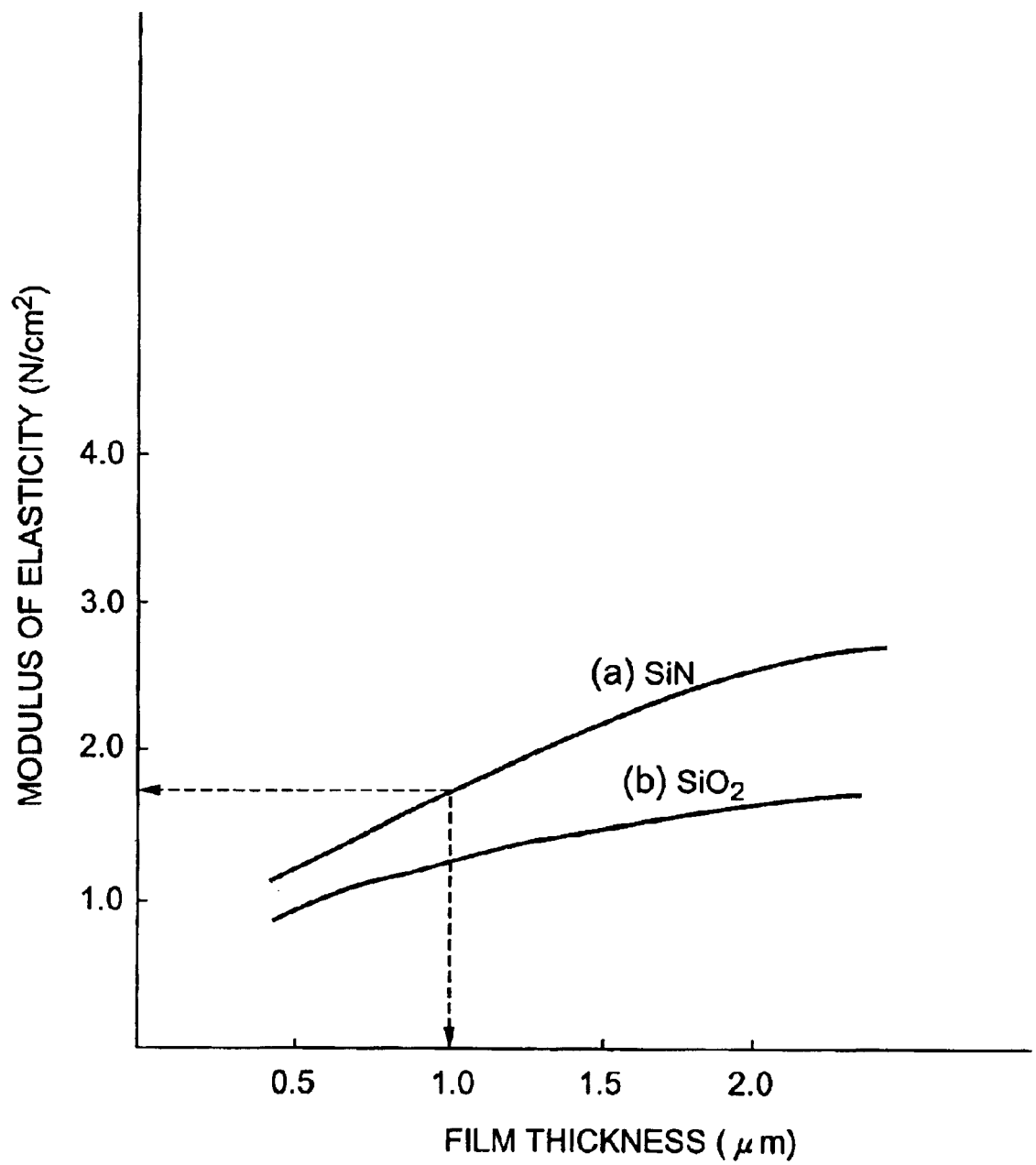
FIG. 8 depicts a relationship between the film thickness and modulus of elasticity of an insulating film.

FIG. 8 depicts an experimentally obtained relationship between the film thickness and modulus of elasticity of an insulating film. According to FIG. 8, the thicker the insulating film is, the larger the modulus of elasticity becomes. Therefore, in the semiconductor integrated device 400 according to the first embodiment of the present invention, the film thickness Xa of the insulating film under the single-layer pad 421 is set greater than the film thickness Xb of the insulating film under the two-layer pad 408.

Moreover, an insulating film constituted of a silicon nitride film instead of a silicon oxide film is effective in increasing the strength. Specifically, the second insulating film 409 receives the pressure applied from a probe to the single-metal-layer pad 421, with which the probe is brought into contact at the time of a wafer test. Moreover, the film thickness of the second insulating film 409 can be selected so that the pressure applied by the probe may be within the elastic limit in experimentally obtained data.

Next, usages of the pads of this semiconductor integrated device will be described. At the time of a wafer test, the single-metal-layer pad 421 is used. At the time of wire bonding, the pad 401 of the two-metal-layer structure 414 is used. Bringing a probe into contact with the single-metal-layer pad 421 at the time of a wafer test reduces damage caused to circuits under pads during the test, whereas using the two-metal-layer pad 414 at the time of wire bonding makes it possible to ensure wire bonding characteristics having increased strength.

Next, a semiconductor integrated device according to a second embodiment of the present invention will be described in detail with reference to a drawing.
(Second Embodiment)

Figure 5:
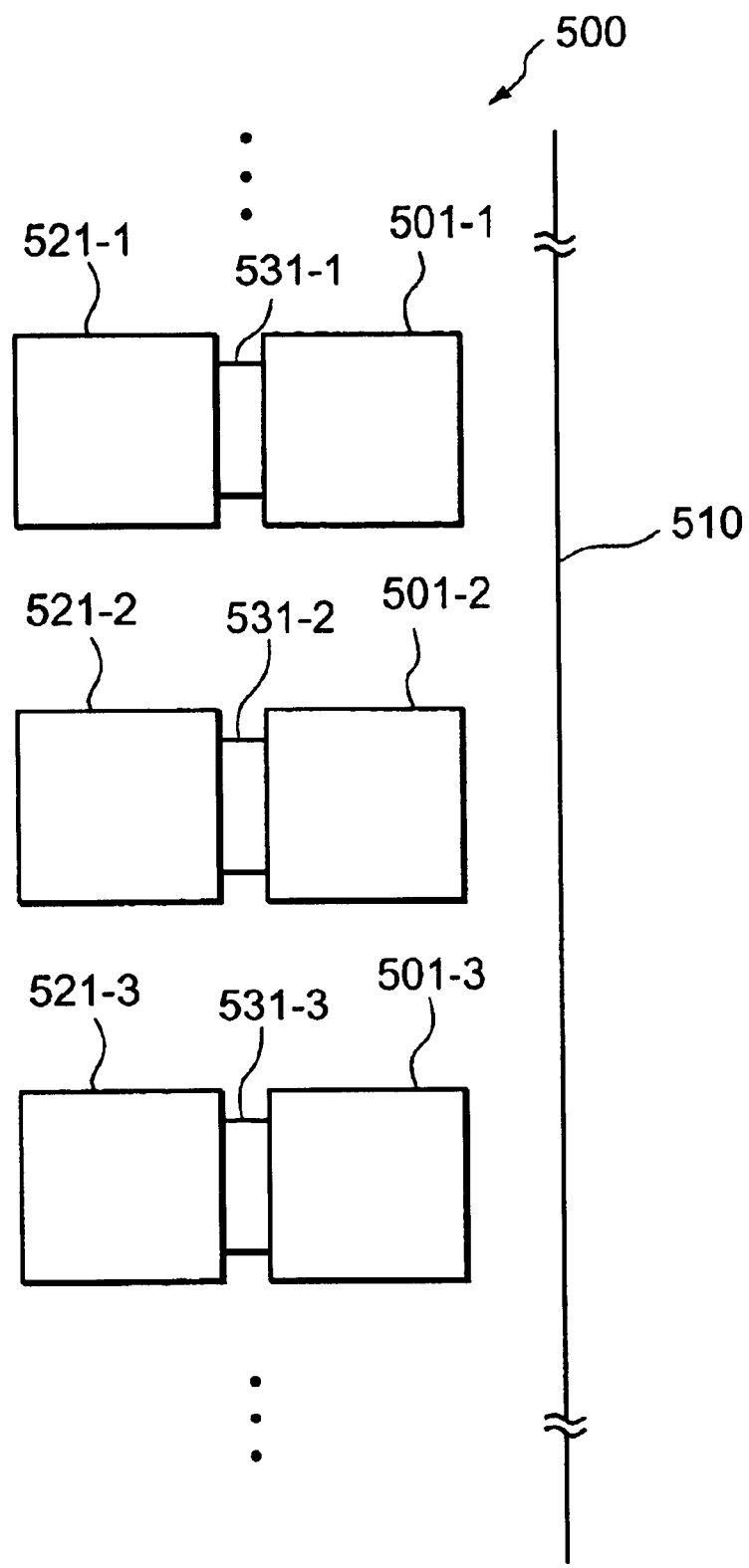
FIG. 5 depicts a plan view of an example of a pad configuration according to a second embodiment of the present invention.

FIG. 5 depicts a plan view of the constitution of the semiconductor integrated device according to the second embodiment of the present invention. Referring to FIG. 5, the semiconductor integrated device 500 according to the second embodiment of the present invention comprises two-layer pads (501-1, 501-2, and 501-3), single-layer pads (521-1, 521-2, and 521-3), an interconnection line 531-1 for connecting the two-layer pad 501-1 and the single-layer pad 521-1, an interconnection line 531-2 for connecting the two-layer pad 501-2 and the single-layer pad 521-2, and an interconnection line 531-3 for connecting the two-layer pad 501-3 and the single-layer pad 521-3. The semiconductor integrated device 500 according to the second embodiment of the present invention has a constitution in which the two-layer pads (501-1, 501-2, and 501-3) are arranged against a chip edge 510 and in which the single-layer pads (521-1, 521-2, and 521-3) are arranged inside the two-layer pads (501-1, 501-2, and 501-3). The constitution of the semiconductor integrated device 500, except for the above, is the same as that of the semiconductor integrated device 400 according to the first embodiment of the present invention. Therefore, a detailed description thereof will be omitted.

Next, a semiconductor integrated device according to a third embodiment of the present invention will be described in detail with reference to a drawing.
(Third Embodiment)

Figure 6:
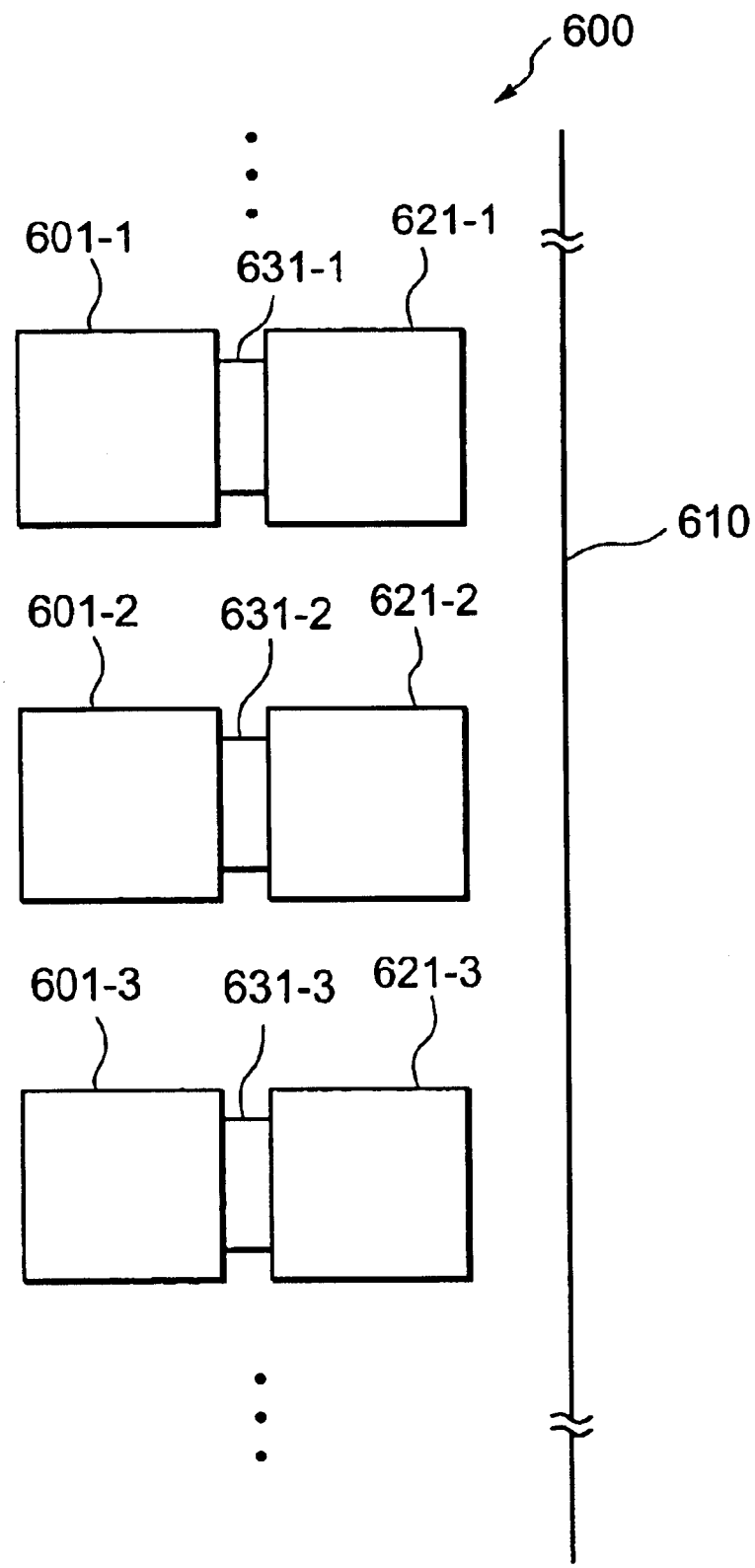
FIG. 6 depicts a plan view of an example of a pad configuration according to a third embodiment of the present invention.

FIG. 6 depicts a plan view of the constitution of the semiconductor integrated device according to the third embodiment of the present invention. Referring to FIG. 6, the semiconductor integrated device 600 according to the third embodiment of the present invention comprises two-layer pads (601-1, 601-2, and 601-3), single-layer pads (621-1, 621-2, and 621-3), an interconnection line 631-1 for connecting the two-layer pad 601-1 and the single-layer pad 621-1, an interconnection line 631-2 for connecting the two-layer pad 601-2 and the single-layer pad 621-2, and an interconnection line 631-3 for connecting the two-layer pad 601-3 and the single-layer pad 621-3. The semiconductor integrated device 600 according to the third embodiment of the present invention has a constitution in which the single-layer pads (621-1, 621-2, and 621-3) are arranged against a chip edge 610 and in which the two-layer pads (601-1, 601-2, and 601-3) are arranged inside the single-layer pads (621-1, 621-2, and 621-3). The constitution of the semiconductor integrated device 600, except for the above, is the same as that of the semiconductor integrated device 400 according to the first embodiment of the present invention. Therefore, a detailed description thereof will be omitted.

Next, a semiconductor integrated device according to a forth embodiment of the present invention will be described in detail with reference to a drawing.
(Fourth Embodiment)

Figure 7:
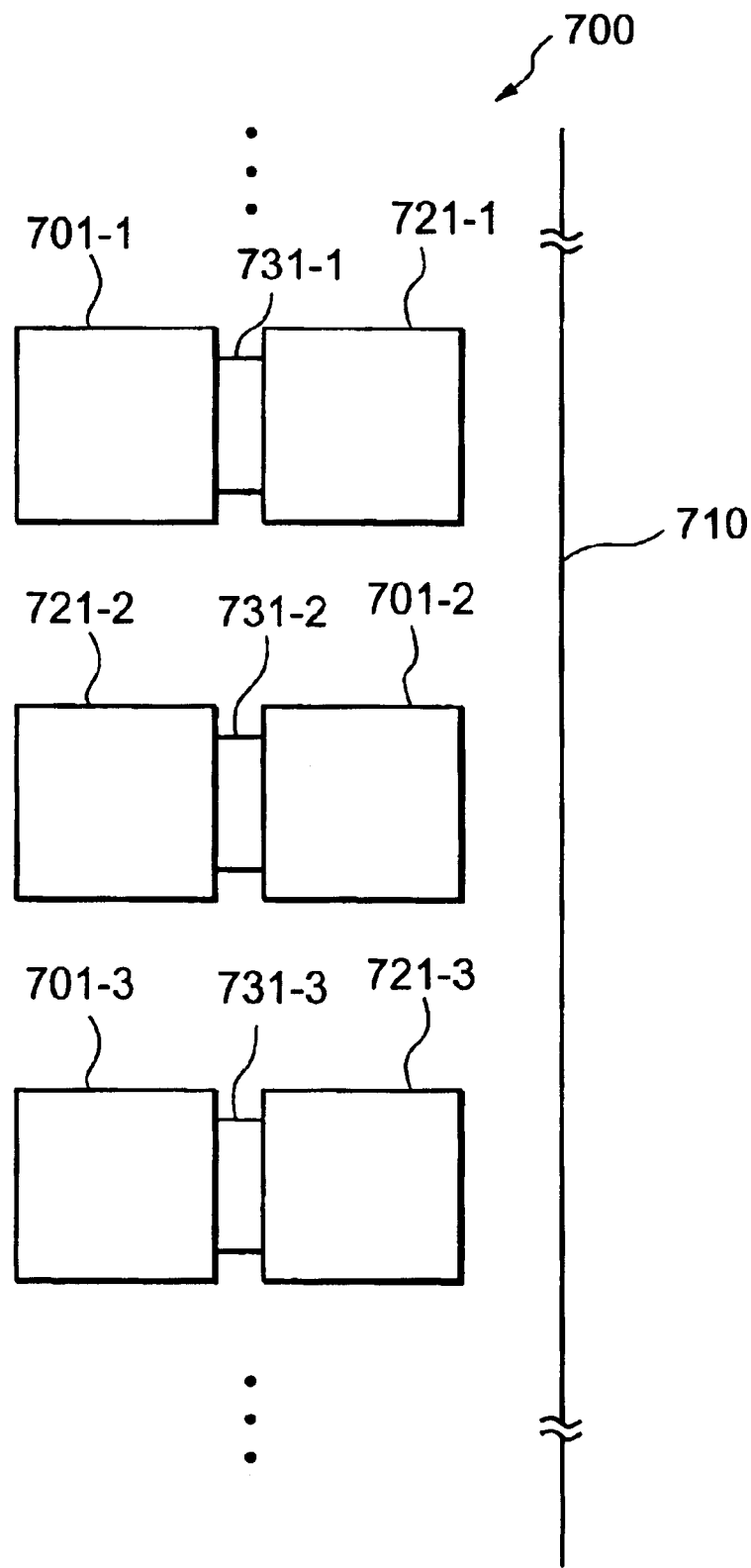
FIG. 7 depicts a plan view of an example of a pad configuration according to a fourth embodiment of the present invention.

FIG. 7 depicts a plan view of the constitution of the semiconductor integrated device according to the fourth embodiment of the present invention. Referring to FIG. 7, the semiconductor integrated device 700 according to the fourth embodiment of the present invention comprises two-layer pads (701-1, 701-2, and 701-3), single-layer pads (721-1, 721-2, and 721-3), an interconnection line 731-1 for connecting the two-layer pad 701-1 and the single-layer pad 721-1, an interconnection line 731-2 for connecting the two-layer pad 701-2 and the single-layer pad 721-2, and an interconnection line 731-3 for connecting the two-layer pad 701-3 and the single-layer pad 721-3.

In the pad layout of the semiconductor integrated device 700 according to the fourth embodiment of the present invention, the two-layer pad (701-1) and the single-layer pad (721-1) are arranged forming a first layout configuration in which the single-layer pad (721-1) is arranged against a chip edge 710 and in which the two-layer pad (701-1) is arranged inside the single-layer pad (721-1). Moreover, the two-layer pad (701-2) and the single-layer pad (721-2) are arranged next to the above-described first layout configuration, forming a second layout configuration in which the two-layer pad (701-2) is arranged against the chip edge 710 and in which the single-layer pad (721-2) is arranged inside the two-layer pad (701-2). Then, the first and second layouts are alternately adopted to arrange two-layer pads and single-layer pads. The constitution of the semiconductor integrated device 600, except for the above, is the same as that of the semiconductor integrated device 400 according to the first embodiment of the present invention. Therefore, a detailed description thereof will be omitted.

As described above, the present invention reduces damage to circuit patterns under pads during a test by using single-metal-layer pads 421 at the time of a wafer test, and makes it possible to ensure bonding characteristics equivalent to those of a conventional pad by using two-metal-layer pads 401 at the time of wire bonding.

It is apparent that the present invention is not is not limited to the above embodiments, but may be modified and changed without departing from the scope and spirit of the invention.

What is claimed is:

1. A semiconductor integrated device provided with a conductive layer and an interlayer insulating film both of which are formed on a semiconductor substrate, the semiconductor integrated device comprising:

a first insulating film formed on any one of the conductive layer and the interlayer insulating film;

a two-layer pad including an upper layer pad and a lower layer pad, the lower layer pad being formed on the first insulating film;

a second insulating film formed on any one of the conductive layer and the interlayer insulating film, the second insulating film having a film thickness greater than that of the first insulating film;

a third insulating film deposited on both of the first insulating film and the lower layer pad of the two-layer pad;

a conductive plug for connecting the upper pad and lower pad of the two-layer pad, the conductive plug being formed in the third insulating film;

the upper layer pad of the two-layer pad being formed on the third insulating film; and a single-layer pad formed on the second insulating film, wherein the single-layer pad is bonded without a bonding wire, and the second layer pad of the two-layer pad is bonded with the bonding wire.

2. The semiconductor integrated device, according to claim 1, wherein the first, second, and third insulating films are silicon oxide films.

3. The semiconductor integrated device, according to claim 2, wherein a film thickness of each silicon oxide film is approximately 0.5 $\mu$m to 1.0 $\mu$m.

4. The semiconductor integrated device, according to claim 1, wherein the first, second, and third insulating films are silicon nitride films.

5. The semiconductor integrated device, according to claim 4, wherein a film thickness of each silicon nitride film is approximately 0.5 $\mu$m to 1.0 $\mu$m.

6. The semiconductor integrated device, according to claim 1, further comprising:

a circuit pattern under both of the single-layer pad and the two-layer pad.

7. The semiconductor integrated device, according to claim 6, wherein the circuit pattern is an I/O buffer.

8. The semiconductor integrated device, according to claim 1, wherein the two-layer pad is arranged against a chip edge of the semiconductor integrated device, and the single-layer pad is arranged inside the two-layer pad.

9. The semiconductor integrated device, according to claim 1, wherein the single-layer pad is arranged against a chip edge of the semiconductor integrated device, and the two-layer pad is arranged inside the single-layer pad.

10. The semiconductor integrated device, according to claim 1, wherein a first layout configuration is formed in which the single-layer pad is arranged against a chip edge and in which the two-layer pad is arranged inside the single-layer pad, and wherein, next to the first layout configuration, a second layout configuration is formed in which the two-layer pad is arranged against the chip edge and in which the single-layer pad is arranged inside the two-layer pad, and wherein the first and second layout configurations are alternately adopted to arrange the two-layer pads and the single-layer pads.

11. A semiconductor device comprising:

a semiconductor chip;

an internal circuit area provided in said semiconductor chip, said internal circuit area including a functional block;

a plurality of buffer areas provided to surround said internal circuit area, each of said buffer areas including an input/output buffer; and a plurality of pad structures each provided above an associated one of said buffer areas, each of said pad structure including an interlayer insulating layer, a bonding pad formed on said interlayer insulating layer, a test pad formed on said interlayer insulating layer apart from said bonding pad, a conductive line electrically connecting said bonding pad and test pad with each other, an intermediate pad layer embedded in said interlayer insulating layer, at least one first contact plug selectively formed in a part of said interlayer insulating layer sandwiched between said bonding pad and said intermediate pad layer to thereby form an conductive path therebetween, and a passivation film formed to cover said boding pad and said test pad and having first and second openings that expose respective parts of said bonding pad and said test pad.

12. The device as claimed in claim 11, further comprising an insulating film covering said semiconductor chip, al least one interconnection layer provided between said insulating film and said interlayer insulating layer.

13. The device as claimed in claim 12, wherein said pad structure further includes at least one second conductive plug selectively formed in a part of said interlayer insulating layer between said intermediate pad layer and said interconnection line to thereby form a conductive path therebetween.

14. The device as claimed in claim 13, wherein said second conductive plug is provided apart in plan view from said bonding pad.

* * * * *